(12) United States Patent
Wang et al.

(10) Patent No.: US 12,057,538 B2
(45) Date of Patent: Aug. 6, 2024

(54) DRIVING SUBSTRATE AND METHOD FOR MANUFACTURING THE SAME, LIGHT-EMITTING SUBSTRATE AND DISPLAY DEVICE

(71) Applicant: BOE TECHNOLOGY GROUP CO., LTD., Beijing (CN)

(72) Inventors: Jianguo Wang, Beijing (CN); Zhanfeng Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 985 days.

(21) Appl. No.: 17/042,101

(22) PCT Filed: Nov. 27, 2019

(86) PCT No.: PCT/CN2019/121197
§ 371 (c)(1),
(2) Date: Sep. 26, 2020

(87) PCT Pub. No.: WO2021/102727
PCT Pub. Date: Jun. 3, 2021

(65) Prior Publication Data
US 2023/0125383 A1 Apr. 27, 2023

(51) Int. Cl.
*H01L 33/62* (2010.01)
*G02F 1/1335* (2006.01)
(Continued)

(52) U.S. Cl.
CPC ........ *H01L 33/62* (2013.01); *G02F 1/133603* (2013.01); *G02F 1/133612* (2021.01); *H01L 23/48* (2013.01); *H01L 25/0753* (2013.01)

(58) Field of Classification Search
None
See application file for complete search history.

(56) References Cited

U.S. PATENT DOCUMENTS 4,365,264 A * 12/1982 Mukai ............... H01L 21/02164
257/641
2005/0017355 A1 * 1/2005 Chou ..................... H01L 24/13
257/E23.021
(Continued)

FOREIGN PATENT DOCUMENTS

| CN | 106444183 A | 2/2017 |
| CN | 109031779 A | 12/2018 |
| CN | 110429089 A | 11/2019 |

*Primary Examiner* — Feifei Yeung Lopez
(74) *Attorney, Agent, or Firm* — HOUTTEMAN LAW LLC

(57) ABSTRACT

A driving substrate, including: a base; a first insulating layer and first conductive wires on the base; the first insulating layer is provided with openings, the first conductive wires are positioned in the openings, and at any position in a lengthwise direction of the first conductive wires, each side surface of each first conductive wire is in contact with a side surface of the opening, where said each first conductive wire is positioned, at least at a partial height; each first conductive wire includes a seed wire and a growth wire; second conductive wires positioned on a side of the first conductive wires away from the base, each second conductive wire is coupled to one first conductive wire and is provided with a coupling area for coupling a light-emitting unit. A method for manufacturing the driving substrate, a light-emitting substrate and a display device are further provided.

19 Claims, 11 Drawing Sheets

(51) Int. Cl.
*G02F 1/13357* (2006.01)
*H01L 23/48* (2006.01)
*H01L 25/075* (2006.01)

(56) References Cited

U.S. PATENT DOCUMENTS

| | | | |
|---|---|---|---|
| 2007/0181895 A1* | 8/2007 | Nagai | H01L 33/385 |
| | | | 438/27 |
| 2008/0149962 A1* | 6/2008 | Kim | H01L 23/62 |
| | | | 257/E33.001 |
| 2010/0079977 A1* | 4/2010 | Lee | G02F 1/133611 |
| | | | 362/97.1 |
| 2013/0207260 A1* | 8/2013 | Hsu | H01L 21/76898 |
| | | | 257/E23.021 |
| 2016/0027857 A1 | 1/2016 | Jin et al. | |
| 2018/0294239 A1* | 10/2018 | Sakata | H01L 23/49816 |
| 2019/0131252 A1* | 5/2019 | Kim | H01L 23/49816 |
| 2020/0161242 A1* | 5/2020 | Lin | H01L 25/0655 |

* cited by examiner

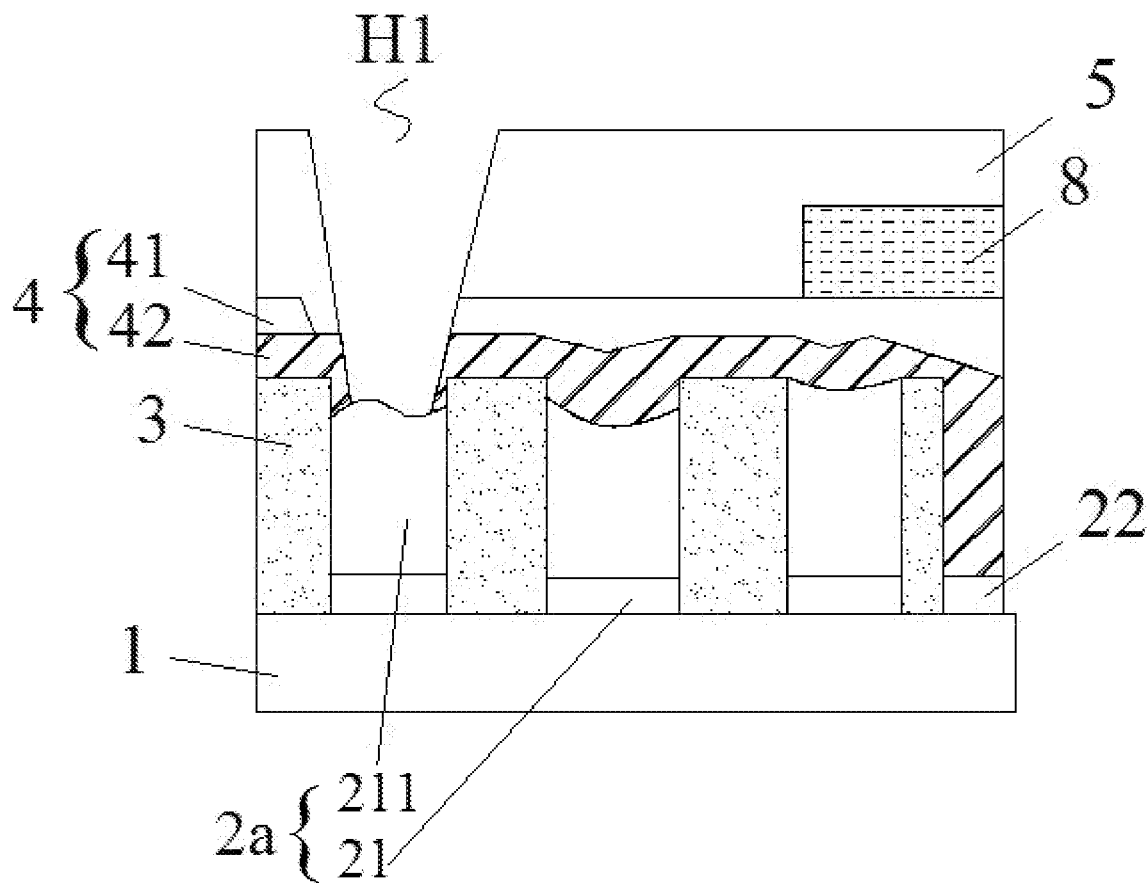

FIG. 4 forming a first insulating layer and a plurality of first conductive wires on a base, the first insulating layer having openings, orthographic projections of the first conductive wires on the base overlap with orthographic projections of the openings on the base, and at any position in a lengthwise direction of the first conductive wires, each side surface of each of the first conductive wires is in contact with a side surface of the opening, where said each of the first conductive wires is located, at least at a partial height —— S1 forming a plurality of second conductive wires, each of which is coupled to one of the first conductive wires and has a coupling area for coupling a light-emitting unit —— S2

FIG 5

DRIVING SUBSTRATE AND METHOD FOR MANUFACTURING THE SAME, LIGHT-EMITTING SUBSTRATE AND DISPLAY DEVICE

TECHNICAL FIELD

The present disclosure relates to the field of display technology, and more particularly, to a driving substrate, a method for manufacturing the driving substrate, a light-emitting substrate, and a display device.

BACKGROUND

A direct-type backlight source can adopt a backlight substrate as a surface light source directly. Generally, the backlight substrate is formed by assembling Printed Circuit Boards (PCBs) each being provided with Micro light-emitting diodes (Micro-LEDs).

Limited by a manufacturing process of the printed circuit board, the minimum wire width of wires in the backlight substrate is difficult to be further reduced, so that the density and the number of Micro-LEDs therein cannot be further increased; meanwhile, due to a size limitation of the printed circuit board, it is difficult to further increase an overall size of the backlight substrate, and as the size of the backlight substrate increases, the number of printed circuit boards to be used also increases. These are not favorable for improving a display quality and an overall size of a liquid crystal display device using the backlight substrate.

SUMMARY

The present disclosure provides a driving substrate, a method for manufacturing the driving substrate, a light-emitting substrate, and a display device.

In a first aspect, there is provided a driving substrate, including:
  a base;
  a first insulating layer and a plurality of first conductive wires on the base; the first insulating layer is provided with openings, the first conductive wires are positioned in the openings, orthographic projections of the first conductive wires on the base overlap with orthographic projections of the openings on the base, and at any position in a lengthwise direction of each of the first conductive wires, each side surface of said each of the first conductive wires is in contact with a side surface of the opening, where said each of the first conductive wires is located, at least in partial height; each of the first conductive wires includes a seed wire and a growth wire stacked sequentially in a direction away from the base;
  a plurality of second conductive wires positioned on a side of the first conductive wires away from the base; each second conducive wire is coupled to one of the first conductive wires and is provided with a coupling area for coupling a light-emitting unit.

In some embodiments, the driving substrate further includes a second insulating layer on a side of the first conductive wires and the first insulating layer away from the base, and on a side of the second conductive wires proximal to the base;
  the second conductive wire is coupled to the first conductive wire through a first via hole penetrating through at least the second insulating layer.

In some embodiments, the second insulating layer is a planarization layer including an organic insulating material; alternatively, the second insulating layer includes a plurality of sub-layers which are stacked, the sub-layers include at least a planarization layer including an organic insulating material and at least a passivation layer including an inorganic material;
  a material of the planarization layer includes any one of polyamide, polyurethane, phenolic resin and polysiloxane;
  a material of the passivation layer includes any one of silicon oxide, silicon nitride and silicon oxynitride.

In some embodiments, the driving substrate further includes a light-reflecting layer located on a side of the second insulating layer away from the base, and a material of the light-reflecting layer includes any one of silver, aluminum and copper.

In some embodiments, the driving substrate further includes a third insulating layer on a side of the second conductive wires away from the base, and a second via hole penetrating through at least the third insulating layer and communicating to the coupling area; the light-reflecting layer is positioned on a side of the third insulating layer away from the base; a material of the third insulating layer includes any one of silicon nitride, silicon oxide, and silicon oxynitride.

In some embodiments, the driving substrate further includes a ground electrode on a side of the third insulating layer proximal to the base;
  the light-reflecting layer is coupled to the ground electrode through a third via hole at least penetrating through the third insulating layer.

In some embodiments, the ground electrode is located on a side of the second insulating layer proximal to the base;
  the light-reflecting layer is coupled to the ground electrode through the third via hole penetrating through the second insulating layer and the third insulating layer.

In some embodiments, the light-reflecting layer is divided into a plurality of light-reflecting blocks spaced apart from each other.

In some embodiments, the driving substrate further includes a fourth insulating layer located on a side of the light-reflecting layer away from the base; the second via hole further penetrates through the fourth insulating layer; a material of the fourth insulating layer includes any one of silicon nitride, silicon oxide, and silicon oxynitride.

In some embodiments, the driving substrate further includes a fifth insulating layer on a side of the second conductive wires proximal to the base; a material of the fifth insulating layer includes any one of silicon nitride, silicon oxide and silicon oxynitride; the light-reflecting layer is floating and is positioned on a side of the fifth insulating layer proximal to the base; the second conductive wire is coupled to the first conductive wire through the first via hole penetrating the second insulating layer and the fifth insulating layer.

In some embodiments, the driving substrate further includes a sixth insulating layer on a side of the second conductive wires away from the base, and a fourth via hole penetrating through the sixth insulating layer and communicating to the coupling area; a material of the sixth insulating layer includes any one of silicon nitride, silicon oxide, and silicon oxynitride.

In some embodiments, the base is a glass base.

In some embodiments, each of the first conductive wires has a thickness between 1 μm and 40 μm.

In some embodiments, a surface of each of the first conductive wires away from the base is flush with a surface of the first insulating layer away from the base.

In some embodiments, the driving substrate further includes:
a buffer layer positioned on a side of the base facing the first insulating layer and on a side of the first insulating layer and the first conductive wires facing the base; a material of the buffer layer includes any one of silicon nitride, silicon oxide, and silicon oxynitride, the buffer layer having a thickness between 500 Å and 3000 Å.

In some embodiments, the driving substrate further includes:
an anti-oxidation layer positioned between the buffer layer and the first insulating layer, and a material of the anti-oxidation layer includes any one of silicon nitride, silicon oxide, silicon oxynitride, indium gallium zinc oxide, indium zinc oxide, gallium zinc oxide and indium tin oxide.

In some embodiments, the seed wire includes a first sub-seed wire and a second sub-seed wire sequentially stacked in the direction away from the base;
a material of the first sub-seed wire includes any one of molybdenum, molybdenum alloy, titanium alloy, indium gallium zinc oxide, indium zinc oxide, gallium zinc oxide and indium tin oxide;
a material of the second sub-seed wire includes copper or gold;
a material of the growth wire includes copper.

In some embodiments, each of the second conductive wires includes a first sub-layer, a second sub-layer, and a third sub-layer stacked sequentially in a direction away from the base;
a material of the first sub-layer includes any one of molybdenum, molybdenum niobium, molybdenum titanium, molybdenum nickel titanium, the first sub-layer having a thickness ranging from 50 Å to 500 Å;
a material of the second sub-layer includes copper;
a material of the third sub-layer includes nickel gold.

In a second aspect, there is provided a method of manufacturing a driving substrate, including:
forming a first insulating layer and a plurality of first conductive wires on a base; the first insulating layer is provided with openings, orthographic projections of the first conductive wires on the base overlap with orthographic projections of the openings on the base, and at any position in a lengthwise direction of the first conductive wires, each side surface of each of the first conductive wires is in contact with a side surface of the opening, where said each of the first conductive wires is located, at least at a partial height; each of the first conductive wires includes a seed wire and a growth wire which are sequentially stacked in a direction away from the base;
forming a plurality of second conductive wires; each second conductive wires is coupled to one of the first conductive wires and is provided with a coupling area for coupling a light-emitting unit.

In some embodiments, the forming the first insulating layer and the plurality of first conductive wires on the base includes:
forming a conductive seed layer on the base, the seed layer includes a plurality of seed wires;
forming the first insulating layer; the seed wires are positioned in the openings, and a side surface of each of the seed wires is in contact with a side surface of the first insulating layer at the opening;
depositing a conductive material on the seed wires by an electroplating process to form the first conductive wires.

In a third aspect, there is provided a light-emitting substrate, including:
the driving substrate according to the first aspect;
a plurality of light-emitting units each coupled to the coupling area;
the light-emitting units are Micro-LEDs or Mini-LEDs.

In some embodiments, the light-emitting substrate is a backlight substrate or a display substrate.

In a fourth aspect, there is provided a display device, including: a light-emitting substrate according to the third aspect.

DESCRIPTION OF DRAWINGS

FIG. 4 is a partial cross-sectional view of a driving substrate according to further another embodiment of the present disclosure;

FIG. 5 is a flowchart of a method for manufacturing a driving substrate according to an embodiment of the present disclosure;

Figure 1A:
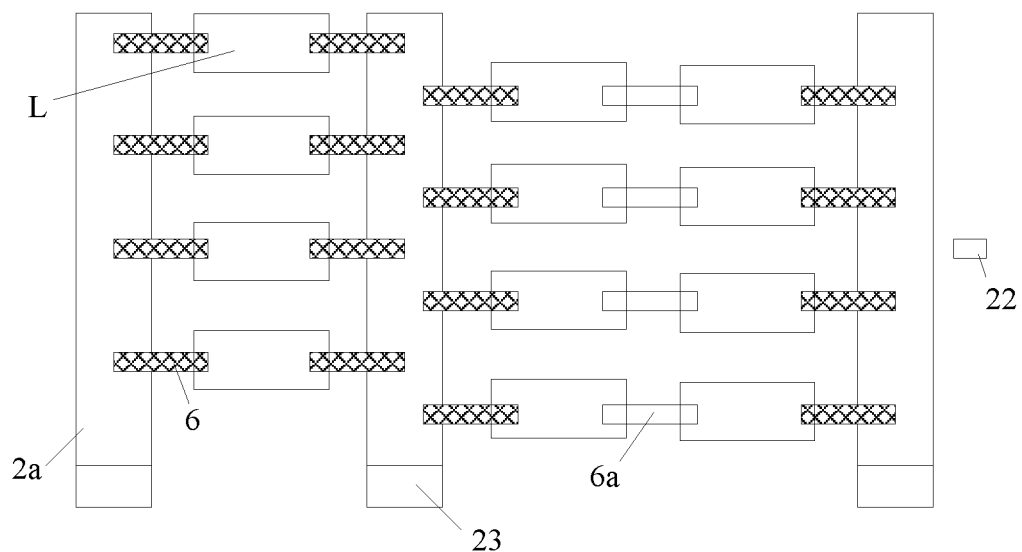
FIG. 1a is a schematic diagram of a connection relationship of a partial structure of a driving substrate according to an embodiment of the present disclosure.

REFERENCE SIGNS 1. base; 18. anti-oxidation layer; 19. buffer layer; 21. seed wire; 21a, first sub-seed wire; 21b, second sub-seed wire; 211. growth wire; 22. ground electrode; 23. bonding pad; 3. first insulating layer; 2a, first conductive wire; 4. second insulating layer; 41. planarization layer; 42. passivation layer; 5. fifth insulating layer; 6. second conductive wire; 61. first sub-layer; 62. second sub-layer; 63. third sub-layer; 6a, third conductive wire; 7. third insulating layer; 8. light-reflecting layer; 9. fourth insulating layer; 10, sixth insulating layer; H1, first via hole; H1', first sub-via hole; H2, second via hole; H3, third via hole; H4, fourth vi hole; 100. electroplated lead; L, light-emitting unit.

DESCRIPTION OF EMBODIMENTS

In order to enable those skilled in the art to better understand technical solutions of embodiments of the present disclosure, the embodiments of the present disclosure are described in detail below with reference to accompanying drawings.

Example embodiments will be described more fully hereinafter with reference to the accompanying drawings, but the example embodiments may be embodied in different forms and should not be construed as limited to the embodiments set forth herein. Rather, the embodiments are provided to make the present disclosure be thorough and complete, and will fully convey the scope of the present disclosure to those skilled in the art.

The terminologies used in the present disclosure are for a purpose of describing particular embodiments only and are not intended to be limiting of the present disclosure. As used herein, the singular forms "a", "an" and "the" are intended to include the plural forms as well, unless the context clearly indicates otherwise. It will be further understood that the terms "includes" and/or "including" when used in the specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements/components/structures, these elements/components/structures should not be limited by these terms. These terms are only used to distinguish one element/component/structure from another element/component/structure.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the embodiments of the present disclosure, "base" refers to a "foundation" for forming thereon a plurality of layers of other structures in a stacked manner, which has a form similar to "display substrate". It should therefore be understood that the substrate (base and structures thereon) is fundamentally different from a Printed Circuit Board (PCB).

In the embodiments of the present disclosure, the fact that the a structure A is located "on a side of a structure B away from the base" or "above" the structure B merely means that the layer of the structure A is formed after the layer of the structure B in a stacking relationship, and does not mean that projections of the structure A and the structure B overlap with each other or that distances between the structure A and the base and between the structure B and the base satisfy a specific relationship.

In the embodiments of the present disclosure, the fact that the structure A is located "on a side of the structure B proximal to the base" or "below" the B structure merely means that the layer of the structure A is formed before the layer of the structure B in a stacking relationship, and does not mean that projections of the structure A and the structure B overlap with each other or that the distances between the structure A and the base and between the structure B and the base satisfy a specific relationship.

In the embodiments of the present disclosure, two structures being in a single layer means that they are formed from a same material layer, and thus are in the single layer in a stacked relationship, but does not represent that the two structures are equidistant from the base, nor that other layer structures between one of the two structures and the base are completely identical to other layer structures between the other one of the two structures and the base.

In the embodiments of the present disclosure, "patterning process" refers to a step of forming a structure having a specific pattern, which may be a photolithography process including one or more steps of forming a material layer, coating a photoresist, exposing, developing, etching, stripping the photoresist, and the like; certainly, the "patterning process" may also be an imprinting process, an inkjet printing process, or other processes.

Referring to FIGS. 1 to 4, an embodiment of the present disclosure provides a driving substrate.

The driving substrate may be coupled to a plurality of light-emitting units L to form a backlight substrate (a type of light-emitting substrate), and the light-emitting units L of the backlight substrate are driven to emit light, so that the backlight substrate may be used in a direct-type backlight source of a liquid crystal display device.

The driving substrate of the embodiment of the present disclosure includes:

a base 1;

a first insulating layer 3 and a plurality of first conductive wires 2a on the base 1; the first insulating layer 3 has openings, the first conductive wires 2a are located in the openings, orthographic projections of the first conductive wires 2a on the base 1 overlap with orthographic projections of the openings on the base 1, and at any position in a lengthwise direction of each of the first conductive wires 2a, each side surface of said each of the first conductive wires 2a is in contact with a side surface of the opening, where said each of the first conductive wire 2a is located, at a partial height at least; each of the first conductive wires 2a includes a seed wire 21 and a growth wire 211 stacked sequentially in a direction away from the base 1;

a plurality of second conductive wires 6 positioned on a side of the first conductive wires 2a away from the base 1; each of the second conductive wires 6 is coupled to one of the first conductive wires 2a, and has a coupling area for coupling a light-emitting unit L.

The driving substrate of the embodiment of the present disclosure includes the first conductive wires 2a formed on the base 1, the first conductive wires 2a have the same shapes as the openings of the first insulating layer 3, and the side surface of each of the first conductive wires 2a is in contact with the first insulating layer 3, or each of the first conductive wire 2a is "filled" in the first insulating layer 3.

The driving substrate further includes second conductive wires 6 above the first conductive wires 2a, each of the second conductive wires 6 being coupled to one of the first conductive wires 2a and having a coupling area exposed at a surface of the driving substrate so that the coupling area can be coupled to the light-emitting unit L, or the coupling area corresponds to a "coupling terminal (or Pad)" on the driving substrate for coupling the light-emitting unit L.

Thus, the first conductive wires 2a actually correspond to "cathode power wires" or "anode power wires" for introducing a power signal to different positions of the driving substrate, and each of the second conductive wires 6 corresponds to a "coupling wire" or a "lead-out wire" for actually coupling a power wire to a corresponding electrode of the light-emitting unit L.

Exemplarily, referring to a left portion of FIG. 1a, a cathode and an anode of each light-emitting unit L (indicated by a dashed frame in the figure) may be respectively coupled to the first conductive wire 2a as a cathode power wire and the first conductive wire 2a as an anode power wire through the second conductive wires 6, and each of the first conductive wires 2a may be coupled to multiple light-emitting units L through multiple second conductive wires 6, respectively, that is, multiple light-emitting units L may be coupled in parallel between the first conductive wire 2a as the cathode power wire and the first conductive wire 2a as the anode power wire.

Certainly, referring to a right portion of FIG. 1a, a plurality of groups of light-emitting units may be coupled in parallel between the first conductive wire 2a as the cathode power wire and the first conductive wire 2a as the anode power wire, each of the groups including a plurality of light-emitting units L coupled in series, in such case, one electrode of each of the light-emitting units L at both ends of a single one of the groups may be coupled to the first conductive wire 2a through the second conductive wire 6, and electrodes of other light-emitting units L may be coupled to each other through third conductive wires 6a. Certainly, for process simplicity, the third conductive wires 6a and the second conductive wires 6 may be disposed in a single layer, and in this case, each of the third conductive wires 6a may also have a coupling area similar to that of the second conductive wire 6 for coupling the light-emitting unit L, but the third conductive wires 6a are not coupled to the first conductive wires 2a.

It should be understood that FIG. 1a is mainly used for illustrating a coupling relationship among the first conductive wires 2a, the second conductive wires 6, the third conductive wires 6a and the light-emitting units L, it does not represent that these structures are all visible at the same time in a top view, nor represents actual sizes, positions, number relationship, etc. of these structures.

Figure 1B:
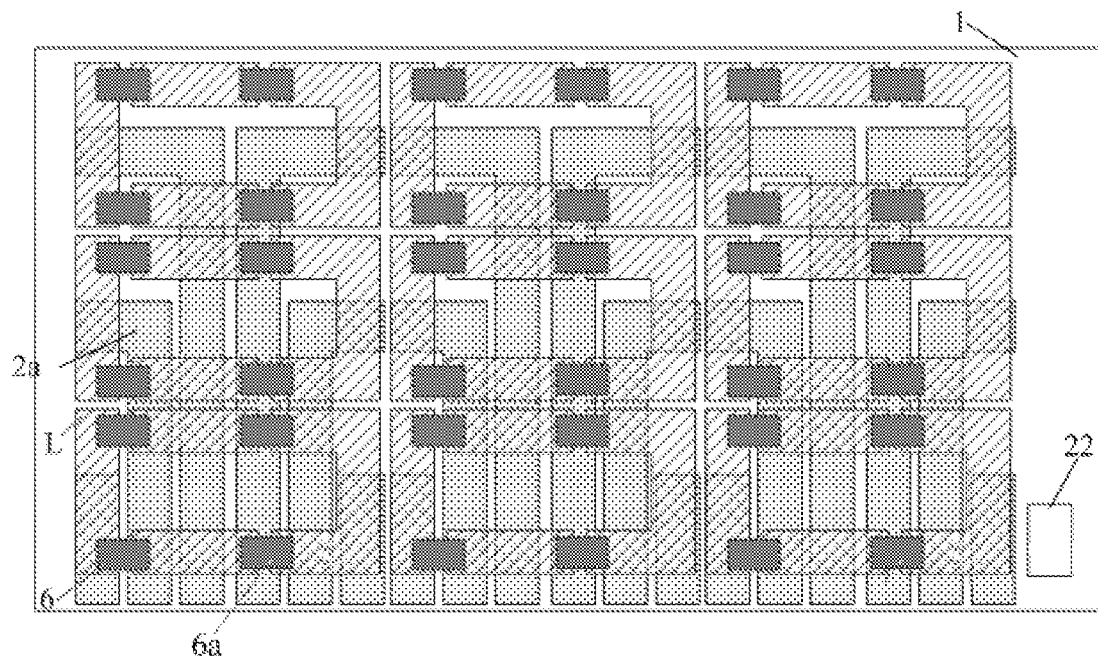
FIG. 1b is a schematic diagram of a connection relationship of a partial structure of a driving substrate according to another embodiment of the present disclosure.

FIG. 1b shows another example of a positional relationship among the first conductive wires 2a, the second conductive wires 6, the third conductive wires 6a, and the light-emitting units L.

Each of the first conductive wires 2a is divided into the seed wire 21 and the growth wire 211 which are stacked.

The seed wire 21 first defines a shape of a conductive wire in an electroplating process for defining a shape of the first conductive wire 2a, and the growth wire 211 is a main conductive wire obtained by electroplating growth on the seed wire 21. The seed wire 21 and the growth wire 211 together constitute the first conductive wire 2a, which indicates that the first conductive wire 2a is formed by processes of growth and electroplating.

Materials of the seed wire 21 and the growth wire 211 may be the same or different, and the seed wire 21 may be further divided into more layers (described in detail later). Due to the processes of growth and electroplating, a thickness of the first conductive wire 2a finally obtained is thick enough, a voltage drop generated on the first conductive wire 2a is small enough, and a quality of product is ensured.

It can be seen that the driving substrate of the embodiment of the present disclosure is a laminated structure formed on the base 1, not a Printed Circuit Board (PCB) laminated by a plurality of plastic plates. Therefore, when the driving substrate is manufactured, the first insulating layer 3 having the openings may be formed by a patterning process, and then the openings may be filled with a conductive material by an electroplating or deposition process to form the first conductive wires 2a.

Since a size of each of the openings in the first insulating layer 3 can be made much smaller than a minimum wire width in a printed circuit board process by the patterning process, accordingly, a wire width of the first conductive wire 2a obtained can be made much smaller than the minimum wire width in the printed circuit board process, so that the number of the light-emitting units L per unit area can be increased, and higher and more uniform brightness and more accurate control can be realized.

Specifically, the minimum wire width in the printed circuit board is usually in a millimeter level, and the minimum wire width of the first conductive wire 2a of the driving substrate in the embodiment of the present disclosure may be 100 μm.

Furthermore, a maximum size of a single "substrate" is typically much larger than a single printed circuit board, and thus the driving substrate can have a larger area, or can be spliced by fewer pieces for the same area.

In some embodiments, the thickness of the first conductive wire 2a is between 1 μm and 40 μm.

It can be seen that since the first conductive wire 2a is "filled" in the opening of the first insulating layer 3, the first conductive wire 2a can be made thick enough accordingly, thereby ensuring that an equivalent resistance of the first conductive wire 2a is small enough and a strong enough conductivity is resulted.

In some embodiments, a surface of the first conductive wire 2a away from the base 1 is flush with a surface of the first insulating layer 3 away from the base 1.

In other words, the first conductive wires 2a "just fill" the openings in the first insulating layer 3 to simplify the process and the structure to the maximum extent.

It should be noted that, due to limitations of the electroplating or deposition process itself, a flatness of the surface of the first conductive wire 2a away from the base 1 is inferior to a flatness of the surface of the first insulating layer 3 away from the base 1, and thus the surface of the first conductive wire 2a away from the base 1 being flush with the surface of the first insulating layer 3 away from base 1 means that such two surfaces are substantially flush with each other.

In some embodiments, a surface of the first conductive wire 2a proximal to the base 1 is flush with a surface of the first insulating layer 3 proximal to the base 1.

In other words, the openings in the first insulating layer 3 penetrate through the first insulating layer 3.

Certainly, the openings in the first insulating layer 3 may not penetrate through the first insulating layer 3, or the first conductive wires 2a may "extend over" or "not completely fill" the openings in the first insulating layer 3.

In some embodiments, the base 1 is a glass base.

The process of forming a structure on a glass base by lamination is well established, and thus glass can be used as a material of the base 1.

The first insulating layer 3 may be supported by using various organic or inorganic insulating materials.

In some embodiments, the material of the first insulating layer 3 is, for example, polyimide resin, polyamide, polyurethane, phenolic resin, polysiloxane, or the like.

In contrast, the first conductive wire 2a (or the growth wire 211 thereof) may be made of a material having a relatively good conductivity.

In some embodiments, the light-emitting unit L is a Micro-LED or a Mini-LED.

The driving substrate of the embodiment of the present disclosure may be used to solder (bond) LEDs (light-emitting diodes), more specifically Micro-LEDs or Mini-LEDs, as the light-emitting units. An overall size of the Micro-LED is usually below 50p m, an overall size of the Mini-LED is usually between 100p m and 200*p* m, and sizes of the Micro-LED and the Mini-LED are not strictly limited in the industry.

Certainly, it is also possible if the light-emitting units are other known light-emitting devices.

A specific structure of the driving substrate according to the embodiment of the present disclosure is described in detail below with reference to FIGS. 2 to 4.

Figure 2:
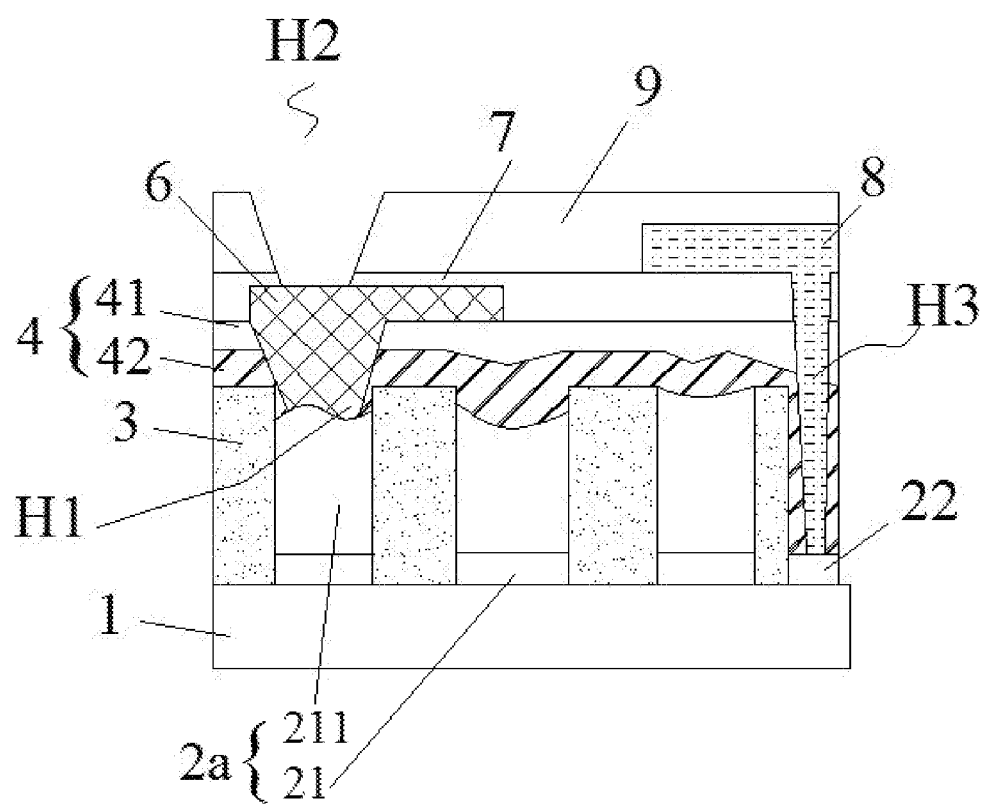
FIG. 2 is a partial cross-sectional view of a driving substrate according to an embodiment of the present disclosure.
Figure 3:
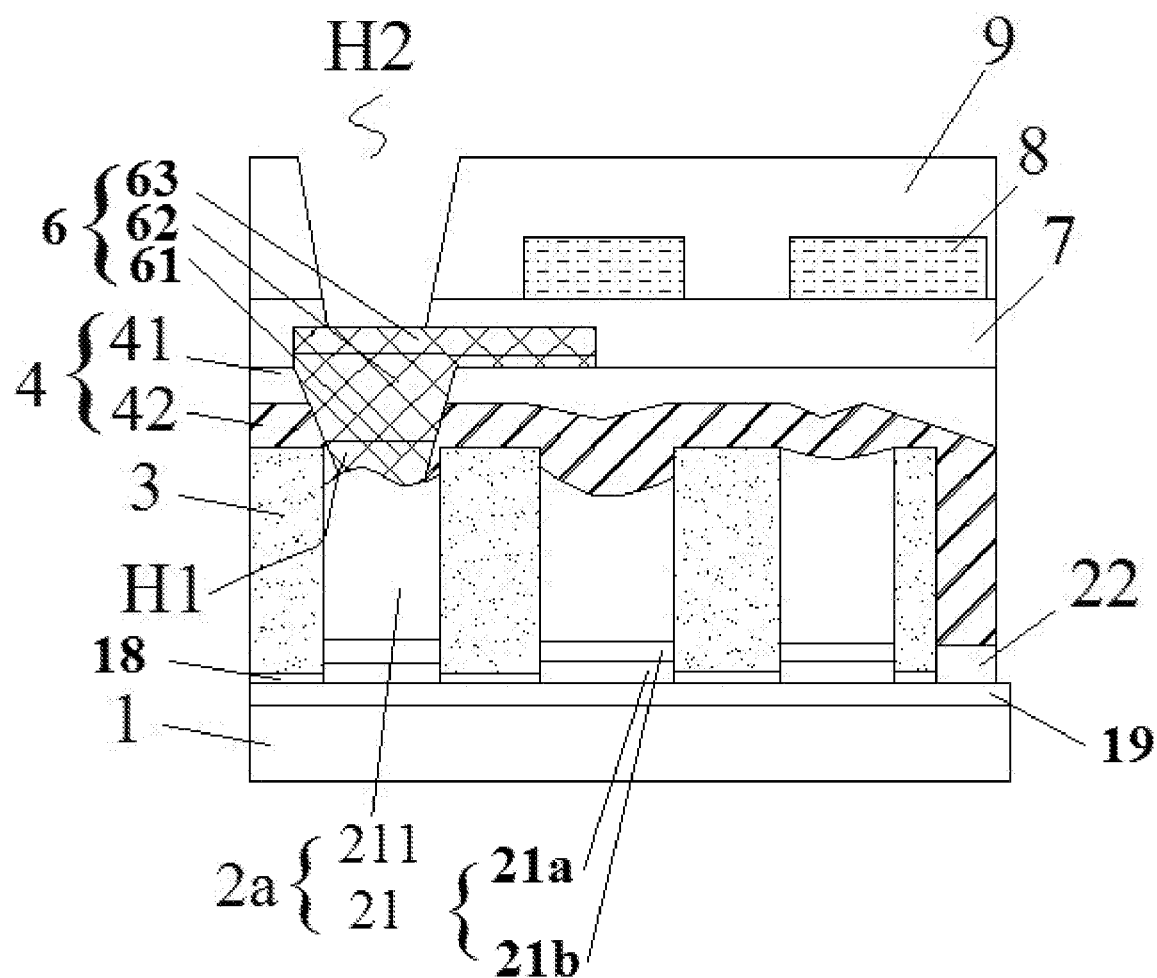
FIG. 3 is a partial cross-sectional view of a driving substrate according to another embodiment of the present disclosure.

It should be understood that FIGS. 2 to 4 are primarily intended to represent a stacking relationship of different structures in the driving substrate, and thus do not represent actual sizes, positions, number relationship, etc. of these structures.

In some embodiments, referring to FIGS. 2 to 4, the driving substrate further includes a second insulating layer 4 on a side of the first conductive wires 2a and the first insulating layer 3 away from the base 1 and on a side of the second conductive wires 6 proximal to the base 1; each second conductive wire 6 is coupled to one of the first conductive wires 2a through a first via hole H1 penetrating through at least the second insulating layer 4.

That is, an insulating layer (the second insulating layer 4) can be disposed between the first conductive wires 2a and the second conductive wires 6, and the second insulating layer 4 is used to protect the first conductive wires 2a (to prevent the first conductive wires 2a from being exposed), and can naturally insulate the first conductive wires 2a from the second conductive wires 6 at a position at which the first conductive wires 2a overlap the second conductive wires 6. Certainly, when the second insulating layer 4 is provided, the second conductive wires 6 can only be coupled to the first conductive wires 2a through the first via holes H1.

In some embodiments, referring to FIGS. 2 to 4, the second insulating layer 4 is a planarization layer 41 including an organic insulating material; alternatively, the second insulating layer 4 includes a plurality of sub-layers, which are stacked, including at least one planarization layer 41 made of an organic insulating material and at least one passivation layer 42 made of an inorganic material.

Due to a relative large thickness of the first conductive wire 2a, thicknesses of the first conductive wire 2a at different positions may be different from each other, for example, a maximum difference between the thicknesses may reach 30%. Thus, an upper surface of the first conductive wire 2a is not flush, and not flush with an upper surface of the first insulating layer 3. In view of this, the second insulating layer 4 may include the planarization layer 41 of organic insulating material to eliminate a thickness difference between upper surfaces of the first conductive wires 2a and the first insulating layer 3, so that subsequent structures (e.g., the second conductive wires 6) may be formed on a relatively flat surface.

The second insulating layer 4 may further include another passivation layer 42 for protecting the organic material layer, for example, the passivation layer 42 may be disposed under the planarization layer 41.

In some embodiments, a material of the passivation layer 42 includes an inorganic insulating material such as silicon oxide, silicon nitride, silicon oxynitride, or the like.

In some embodiments, a material of the planarization layer 41 includes an organic insulating material such as polyamide, polyurethane, phenolic resin, polysiloxane, and the like.

In some embodiments, referring to FIGS. 2 to 4, the driving substrate further includes a light-reflecting layer 8 on a side of the second insulating layer 4 away from the base 1.

The light-reflecting layer 8 may be provided above the second insulating layer 4, but the light-reflecting layer 8 is not necessarily in direct contact with the second insulating layer 4. A portion of light emitted from the light-emitting units L subsequently bonded on the driving substrate may be directly emitted to the base 1, or a portion of the light may be reflected by a liquid crystal display panel to the base 1, and the light-reflecting layer 8 may reflect the light in a direction away from the base 1, so as to improve an utilization rate of the light.

Referring to FIGS. 2 and 3, the second conductive wires 6 may be closer to the base 1 than the light-reflecting layer 8, so that a coupling portion between the second conductive wire 6 and the first conductive wire 2a is shorter, lower in resistance, and lower in voltage loss.

Referring to FIG. 4, the second conductive wire 6 may be farther from the base 1 than the light-reflecting layer 8, and the light-reflecting layer 8 may be capable of reflecting more light emitted from the light-emitting units L.

In some embodiments, the light-reflecting layer 8 may be made of a metal material with high reflectivity, such as silver, aluminum, copper, or the like.

In some embodiments, referring to FIGS. 2 to 3, the driving substrate further includes a third insulating layer 7 on a side of the second conductive wires 6 away from the base 1, and a second via hole H2 penetrating through at least the third insulating layer 7 and communicating to the coupling area; the light-reflecting layer 8 is positioned on a side of the third insulating layer 7 away from the base 1.

The third insulating layer 7 may be further disposed over the second conductive wires 6 to protect the second conductive wires 6 (to prevent the second conductive wires 6 from being exposed), and at the same time, the third insulating layer 7 can make the second conductive wires 6 not electrically couple to the light-reflecting layer 8 even though they overlap, thereby increasing an area of the light-reflecting layer 8.

Certainly, at this time, the second via hole H2 must be provided in the third insulating layer 7 so that the coupling area of the second conductive wire 6 can be exposed to be coupled to the light-emitting unit L.

In some embodiments, a material of the third insulating layer 7 includes, for example, silicon nitride, silicon oxide, silicon oxynitride, or the like.

In some embodiments, referring to FIGS. 2 to 3, the driving substrate further includes a fourth insulating layer 9 on a side of the light-reflecting layer 8 away from the base 1; the second via hole H2 also penetrates through the fourth insulating layer 9.

When the light-reflecting layer 8 is disposed above the third insulating layer 7, the fourth insulating layer 9 may be further disposed above the light-reflecting layer 8 to protect the light-reflecting layer 8.

Certainly, at this time, the second via hole H2 also penetrates the fourth insulating layer 9 so that the coupling area of the second conductive wire 6 can be exposed to be coupled to the light-emitting unit L.

In some embodiments, a material of the fourth insulating layer 9 includes, for example, silicon nitride, silicon oxide, silicon oxynitride, or the like.

As a specific mode of the embodiment of the present disclosure, referring to FIG. 2, the driving substrate further includes a ground electrode 22 on a side of the third insulating layer 7 proximal to the base 1; the light-reflecting layer 8 is coupled to the ground electrode 22 through a third via hole H3 that penetrates through at least the third insulating layer 7.

The driving substrate generally has the ground electrode 22 capable of providing a signal at zero level, and the ground electrode 22 is generally provided below the third insulating layer 7 for process simplicity. In order to avoid an adverse effect caused by an induction generated in the light-reflecting layer 8, the light-reflecting layer 8 may be coupled to the ground electrode 22 (i.e., the light-reflecting layer 8 is grounded) through the third via hole H3 penetrating through the third insulating layer 7 (because the light-reflecting layer 8 is above the third insulating layer 7).

In some embodiments, referring to FIG. 2, the ground electrode 22 is located on the side of the second insulating layer 4 proximal to the base 1; the light-reflecting layer 8 is coupled to the ground electrode 22 through the third via hole H3 penetrating through the second insulating layer 4 and the third insulating layer 7.

Specifically, the ground electrode 22 may be located lower than the second insulating layer 4, so that it may be disposed in the same layer as the seed layer 21 of the first conductive wire 2a (but the ground electrode 22 is not disposed in the same layer as the first conductive wire 2a), i.e., the ground electrode 22 may be formed at the same time as the seed layer 21, thereby simplifying the process.

Certainly, the third via hole H3 further needs to penetrate through the second insulating layer 4 at this time to realize grounding of the light-reflecting layer 8.

In some embodiments, referring to FIG. 3, the light-reflecting layer 8 is divided into a plurality of light-reflecting blocks which are spaced apart from each other.

Specifically, the light-reflecting layer 8 may be divided into a plurality of blocks independent to each other, so that a parasitic capacitance formed by each block is relative small.

Certainly, it is also feasible if the light-reflecting layer 8 is an integrative structure, as long as it has a gap at a position to avoid undesired coupling with other structures.

As a specific mode of the embodiment of the present disclosure, the light-reflecting layer 8 is floating.

When the light-reflecting layer 8 is provided on the third insulating layer 7, the light-reflecting layer 8 may be floating (if it is divided into light-reflecting blocks, each block is floating), that is, the light-reflecting layer 8 is not coupled to the ground electrode 22. Accordingly, it does not need to form the third via hole H3 in the second insulating layer 4 and the third insulating layer 7, and the process is simplified.

Certainly, since the light-reflecting layer 8 is not coupled to the ground electrode 22, the ground electrode 22 may not be provided in the driving substrate.

As a specific mode of the embodiment of the present disclosure, referring to FIG. 4, the driving substrate further includes a fifth insulating layer 5 on a side of the second conductive wires 6 proximal to the base 1; the light-reflecting layer 8 is floating and is positioned on a side of the fifth insulating layer 5 proximal to the base 1; the second conductive wire 6 is coupled to the first conductive wire 2a through a first via hole H1 penetrating through the second insulating layer 4 and the fifth insulating layer 5.

That is, the light-reflecting layer 8 may also be disposed between the second conductive wires 6 and the second insulating layer 4, and is floating in a manner adopted as above; in order to avoid an electrical coupling between the light-reflecting layer 8 and the second conductive wires 6, the fifth insulating layer 5 is further disposed between the light-reflecting layer 8 and the second conductive wires 6.

In this case, the first via hole H1 needs to penetrate through the second insulating layer 4 and the fifth insulating layer 5 to make the second conductive wire 6 couple to the first conductive wire 2a. However, no via hole for coupling the light light-reflecting layer 8 to the ground electrode 22 is provided in the second insulating layer 4 (because of the light light-reflecting layer 8).

In some embodiments, a material of the fifth insulating layer 5 includes, for example, silicon nitride, silicon oxide, silicon oxynitride, or the like.

In some embodiments, referring to FIG. 4, the driving substrate further includes a sixth insulating layer 10 on a side of the second conductive wires 6 away from the base 1, and a fourth via hole H4 penetrating through the sixth insulating layer 10 and communicating to the coupling area.

At this time, the second conductive wires 6 form an outermost conductive structure, and thus the sixth insulating layer 10 may be further disposed to protect the second conductive wires 6, and the coupling area of the second conductive wire 6 for coupling the light-emitting unit is exposed through the fourth via hole H4.

In some embodiments, a material of the sixth insulating layer 10 includes, for example, silicon nitride, silicon oxide, silicon oxynitride, or the like.

In some embodiments, referring to FIG. 3, the driving substrate further includes a buffer layer 19 located on a side of the base 1 facing the first insulating layer 3 and on a side of the first insulating layer 3 and the first conductive wires 2a facing the base 1, a material of the buffer layer 19 including any one of silicon nitride, silicon oxide, and silicon oxynitride, a thickness of the buffer layer 19 being between 500 Å and 3000 Å

That is, the buffer layer 19 may be disposed between the first conductive wires 2a (seed wires 21) and the base 1, and the buffer layer 19 functions to increase adhesion of the seed wires 21 subsequently formed on the base 1.

In some embodiments, referring to FIG. 3, the driving substrate further includes an anti-oxidation layer 18 between the buffer layer 19 and the first insulating layer 3, and a material of the anti-oxidation layer 18 includes any one of silicon nitride, silicon oxide, silicon oxynitride, indium gallium zinc oxide, indium zinc oxide, gallium zinc oxide, and indium tin oxide.

That is to say, the anti-oxidation layer 18 may be provided between the buffer layer 19 and the first insulating layer 3 and in contact with both the buffer layer 19 and the first insulating layer 3 (i.e., the anti-oxidation layer 18 is not only in a laminated relationship between the buffer layer 19 and the first insulating layer 3, but is indeed sandwiched between the buffer layer 19 and the first insulating layer 3). The anti-oxidation layer 18 serves to protect the seed layer (seed wire 21) from being oxidized at a high temperature when the first insulating layer 3 is formed In some embodiments, with reference to FIG. 3, the seed wire 21 includes a first sub-seed wire 21a and a second sub-seed wire 21b stacked sequentially in a direction away from the base 1; a material of the first sub-seed wire 21a includes any one of molybdenum, molybdenum alloy, titanium alloy, indium gallium zinc oxide (IGZO), indium zinc oxide (IZO), gallium zinc oxide (GZO), indium tin oxide (ITO); a material of the second sub-seed wire 21b includes copper or gold; a material of the growth wire 211 includes copper.

That is, the seed wire 21 may be further divided into two sub-layers, the sub-layer (the first sub-seed wire 21a) proximal to the base 1 is used as a barrier layer to increase a bonding force between a subsequent layer and the base 1, and the sub-layer (the second sub-seed wire 21b) away from the base 1 is used as a material with better conductivity, such as copper or gold, to facilitate growth of the growth wire 211, and the growth wire 211 may include a copper material with good conductivity and low price.

In some embodiments, referring to FIG. 3, each of the second conductive wires 6 includes a first sub-layer 61, a second sub-layer 62, and a third sub-layer 63 stacked sequentially in a direction away from the base 1; a material of the first sub-layer includes any one of molybdenum (Mo), molybdenum niobium (MoNb), molybdenum titanium (MoTi), molybdenum nickel titanium (MoNiTi), a thickness of the first sub-layer 61 ranging from 50 Å to 500 Å; a material of the second sub-layer 62 includes copper (Cu); a material of the third sub-layer 63 includes nickel gold (NiAu).

The second conductive wire 6 may be divided into three sub-layers, the sub-layer proximal to the base 1 (the first sub-layer 61) serves to improve a bonding force of a subsequent copper layer, the middle copper sub-layer (the second sub-layer 62) plays a major role in electrical conductivity, and the uppermost nickel gold sub-layer (the third sub-layer 63) serves to increase an adhesion force when the light-emitting unit L (e.g., Micro-LED) is subsequently coupled (e.g., soldered) to the coupling area of the second conductive wire 6 and to protect the middle copper sub-layer from oxidation.

Referring to FIG. 5, an embodiment of the present disclosure further provides a method for manufacturing the driving substrate described above. The method includes the following steps S1 and S2.

Step S1, forming a first insulating layer and a plurality of first conductive wires on a base, the first insulating layer having openings, orthographic projections of the first conductive wires on the base overlap with orthographic projections of the openings on the base, and at any position in a lengthwise direction of the first conductive wires, each side surface of each of the first conductive wires is in contact with a side surface of the opening, where said each of the first conductive wires is located, at least at a partial height; each of the first conductive wires includes a seed wire and a growth wire stacked sequentially in a direction away from the base.

Step S2, forming a plurality of second conductive wires, which are respectively coupled to respective one of the first conductive wires and each of which has a coupling area for coupling a light-emitting unit.

By forming each of the structures of the aforementioned driving substrate correspondingly, the aforementioned driving substrate can be manufactured.

Figure 6:
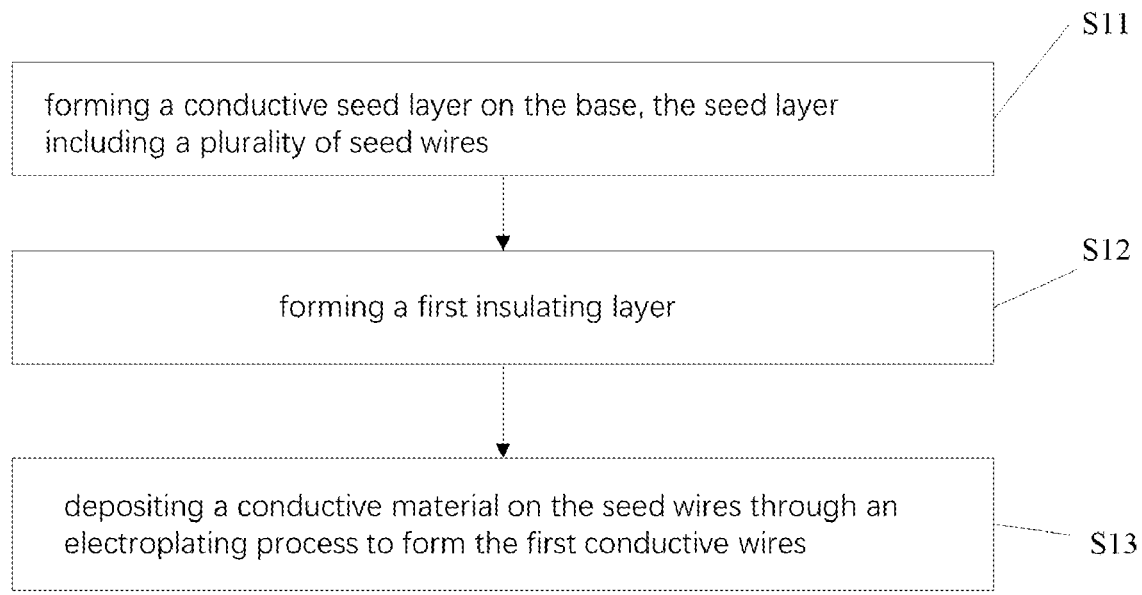
FIG. 6 is a flowchart of a method for forming a first insulating layer and a first conductive wire of a driving substrate according to an embodiment of the present disclosure.

In some embodiments, referring to FIGS. 6 to 7, the above step (S1) of forming the first insulating layer 3 and the plurality of first conductive wires 2a on the base may specifically include the following steps S11 to S13.

Figure 7A:
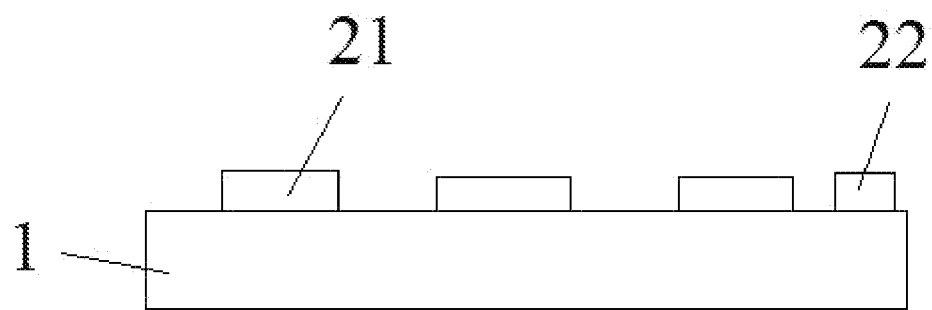
FIGS. 7a to 7d are schematic product configuration diagrams of a driving substrate of an embodiment of the present disclosure at an initial stage of fabrication.

At step S11, referring to FIG. 7a, a conductive seed layer is formed on the base 1, the seed layer including the plurality of seed wires 21.

Through a patterning process, the seed layer is formed of a conductive material on the base 1, the seed layer including at least the seed wires 21 at positions corresponding to the first conductive wires 2a.

The seed layer may further include bonding pads 23 coupled to the seed wires 21, and the ground electrode 22 as above.

That is, the seed layer may include some other structures in addition to the seed wires 21 for subsequently forming the first conductive wires 2a. The bonding pad 23 may be located at an end of the seed wire 21, i.e., it will be electrically coupled to the first conductor wire 2a subsequently formed, and thus may act as a "coupling terminal" for introducing a signal into the first conductor wire 2a. The ground electrode 22 functions to provide a ground signal.

Certainly, the seed layer (seed wire 21) may have a double-layer structure.

Meanwhile, the above buffer layer may be first formed on the base 1 before forming the seed layer.

Figure 7B:
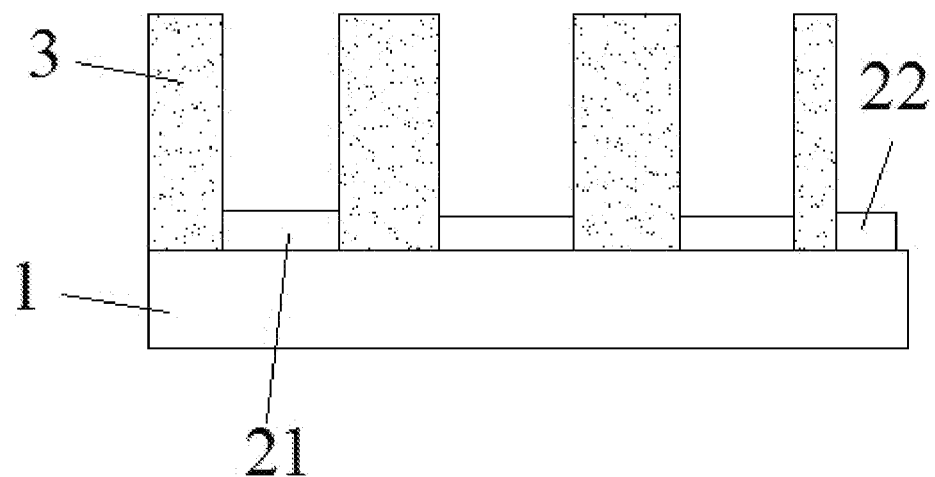

At step S12, referring to FIG. 7b, the first insulating layer 3 is formed.

Each of the seed wires 21 is located in an opening, and a side surface of the seed wire 21 is in contact with a side surface of the first insulating layer 3 at the opening.

The first insulating layer 3 having the openings as above is formed by using a patterning process or the like, and a pattern of the opening in the first insulating layer 3 should completely overlap with a pattern of the seed wire 21 (i.e., a pattern of the first conductive wire 2a).

Figure 7C:
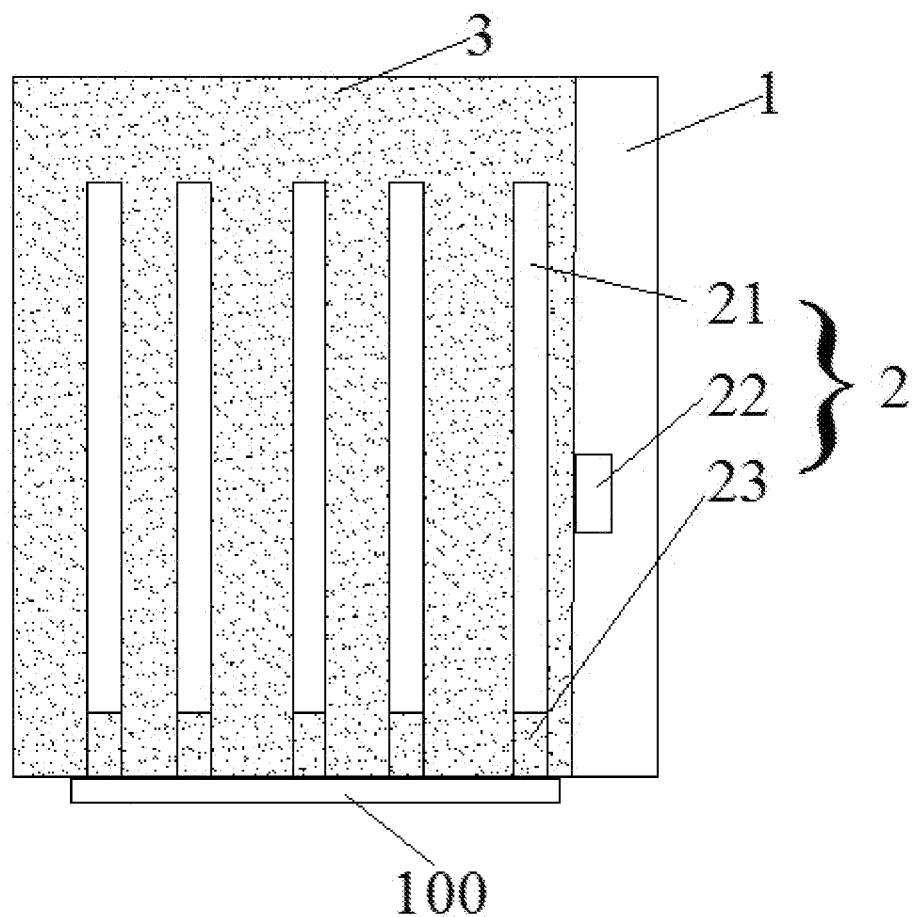

Here, the bonding pad 23 as above does not need to be grown by electroplating in a subsequent process, and thus referring to FIG. 7c, the bonding pad 23 is covered by the first insulating layer 3 (i.e., does not correspond to the opening) at this time.

An area where the ground electrode 22 is located may not be covered by the first insulating layer 3.

A specific process of this step may include:

firstly, covering an anti-oxidation layer on the seed layer; and thereafter, forming the first insulating layer 3 by using a patterning process.

Certainly, the anti-oxidation layer at a position where there is no the first insulating layer 3 is removed at this time, thereby forming the anti-oxidation layer as above between the buffer layer and the first insulating layer 3.

Figure 7D:
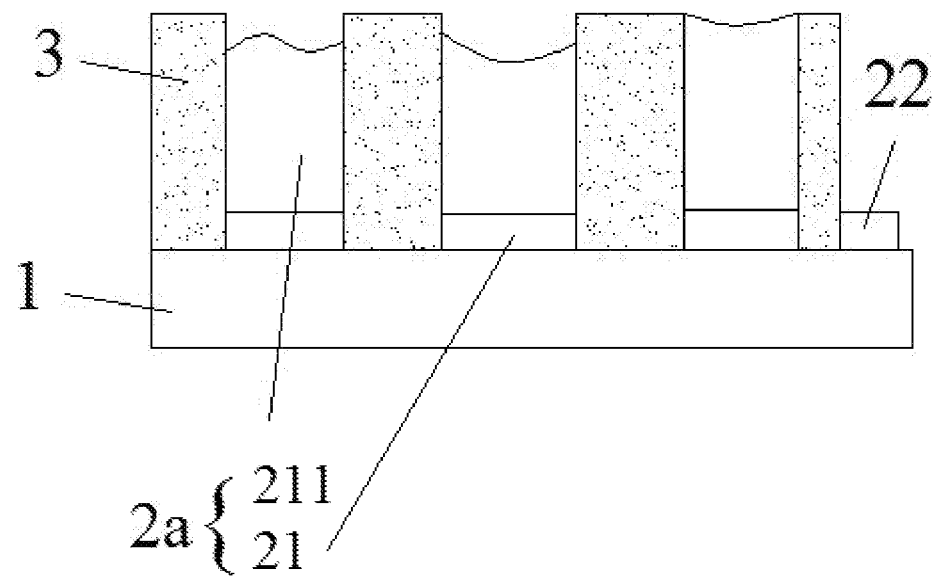

At step S13, referring to FIGS. 7c and 7d, a conductive material is deposited on the seed wire 21 through an electroplating process to form the first conductive wire 2a.

Specifically, the seed wire 21 is energized through an electroplating lead 100 provided outside, and the electroplating process is performed continuously on the seed wire 21 to obtain the growth wire 211, thereby forming the first conductive wire 2a. The first insulating layer 2a forms a bank which encloses the opening as above, so that the conductive material grows only in the opening subsequently, to form the first conductive wire 2a which "fills" the opening in the first insulating layer 3.

The thickness of the first conductive wire 2a can be controlled by controlling an electroplating time and an electroplating current.

The product after completion of step S13 is shown in FIG. 7d. To this end, a preparation of the first conductive wire 2a and the first insulating layer 3 of the driving substrate is completed.

In some embodiments, referring to FIG. 8, the step (S2) of forming the plurality of second conductive wires may specifically include the following steps S21 to S23.

At step S21, the passivation layer 42 as above is formed by using a patterning process.

Figure 8A:
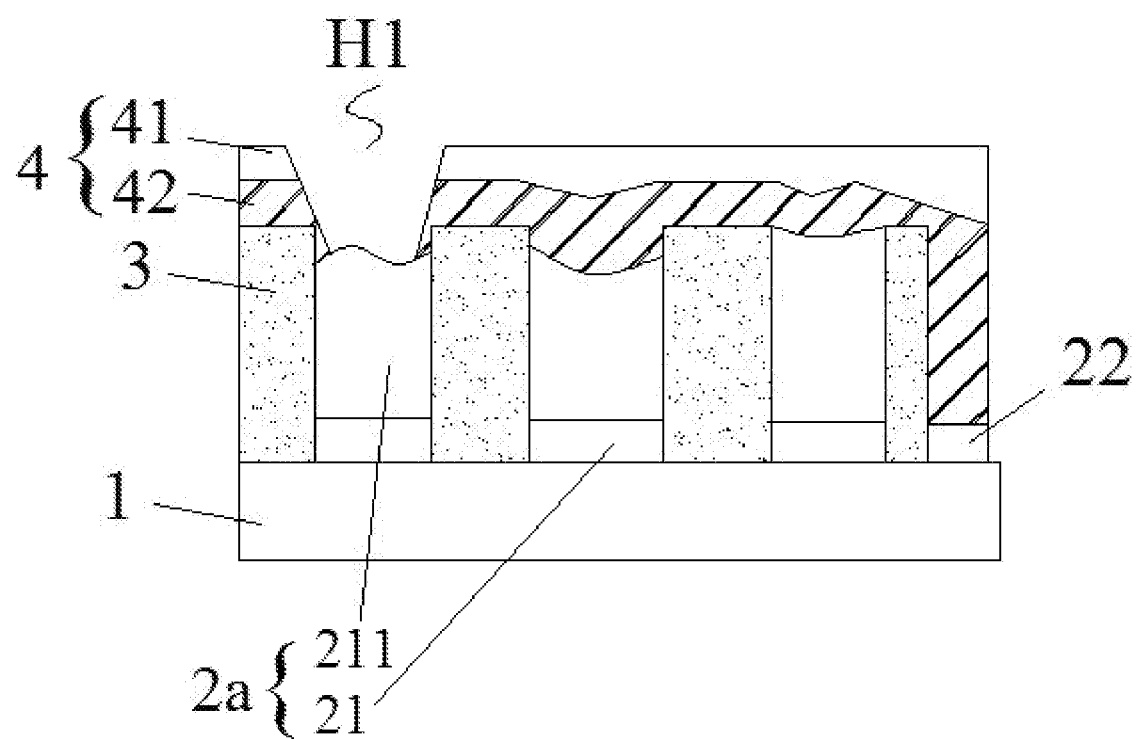
FIGS. 8a to 8d are schematic product configuration diagrams of the driving substrate shown in FIG. 2 at different stages of fabrication.

At step S22, referring to FIG. 8a, the planarization layer 41 as above is formed by using a patterning process.

Figure 8B:
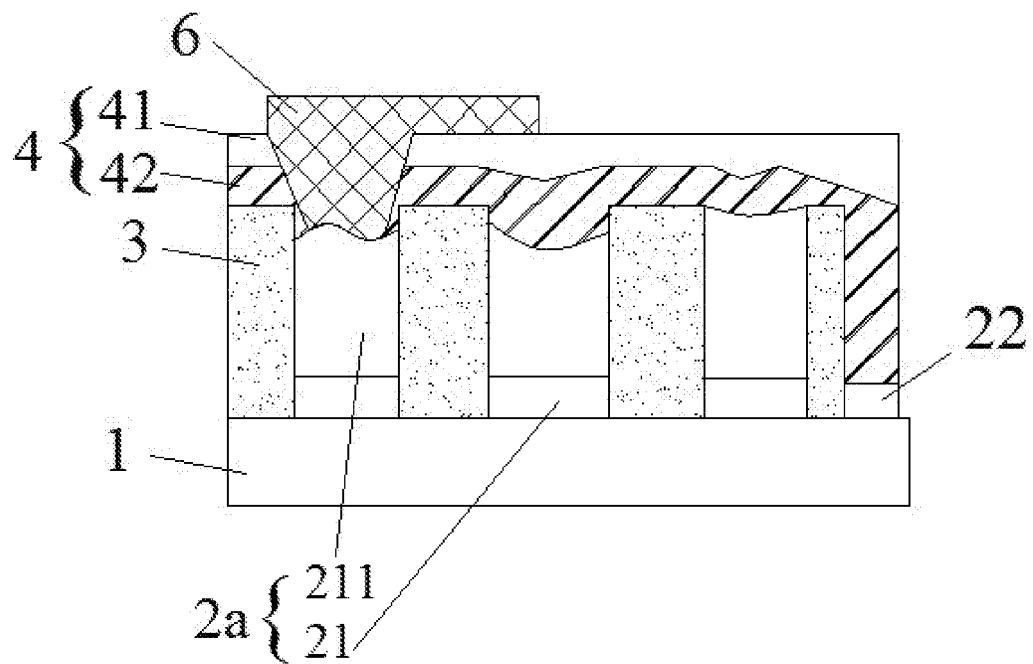

At step S23, referring to FIG. 8b, the second conductive wire 6 as above is formed by using a patterning process.

Specifically, the second conductive wire 6 may have a multilayer structure, such as three-layer structure as above.

As a specific mode of the embodiment of the present disclosure, referring to FIG. 8, when the driving substrate referring to FIG. 2 is to be formed, after the step S2, the following steps S31 to S33 may be further included.

The first via hole H1 penetrating through the second insulating layer 4 (the planarization layer 41 and the passivation layer 42) can be obtained by a single patterning process when the planarization layer 41 is formed, that is, when the subsequent steps are performed, the first via hole H1 has been already formed.

Figure 8C:
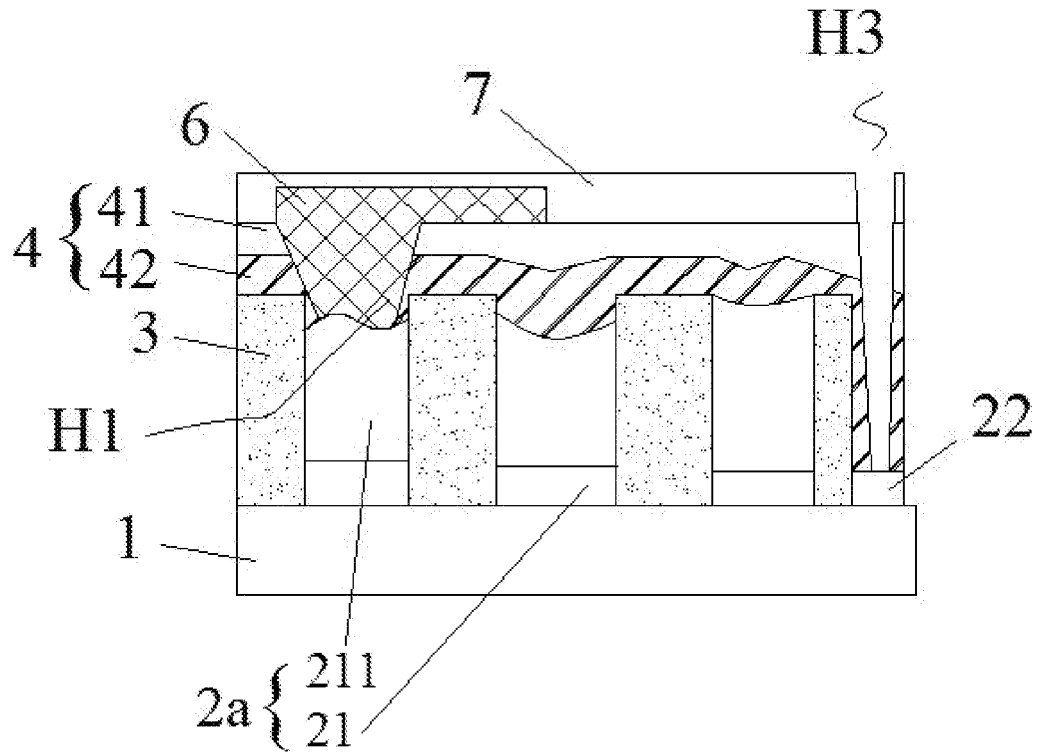

Step S31, referring to FIG. 8c, the third insulating layer 7 as above is formed by using a patterning process.

Obviously, the third via hole H3 penetrating through the third insulating layer 7 and the second insulating layer 4 and coupled to the ground electrode 22 of the base 1 can be obtained by a single patterning process when the third insulating layer 7 is formed.

Figure 8D:
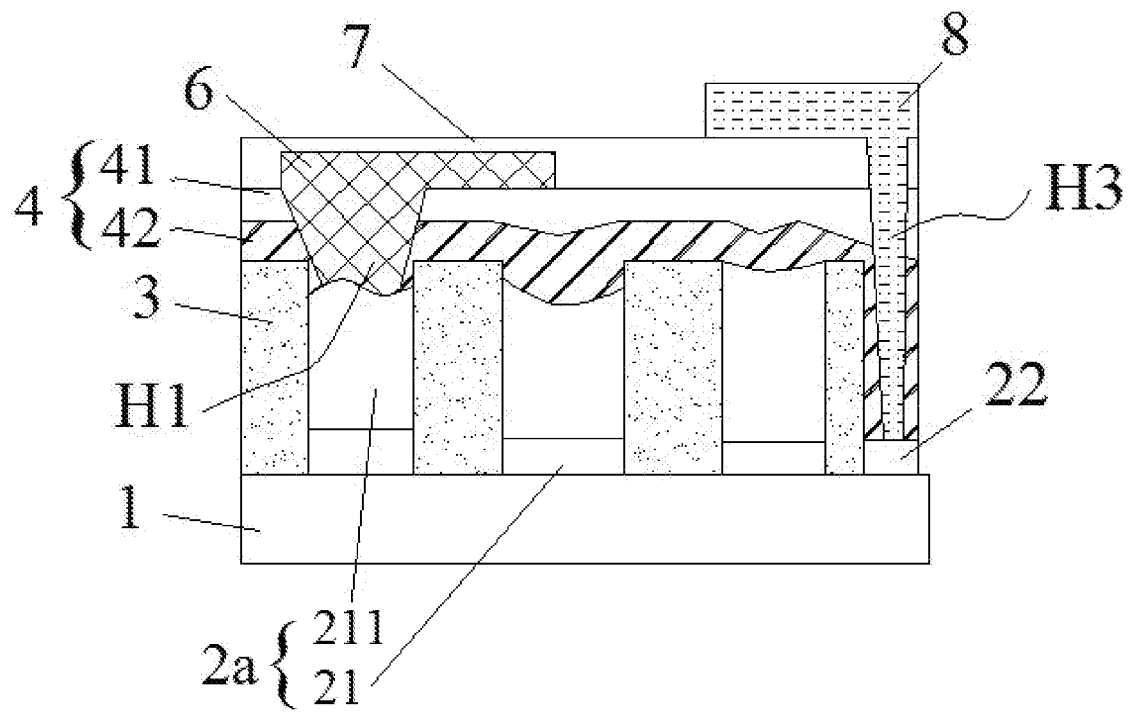

At step S32, referring to FIG. 8d, the light-reflecting layer 8 as above is formed by using a patterning process.

At step S33, referring to FIG. 2, the fourth insulating layer 9 as above is formed by using a patterning process.

Obviously, the above second via H2 penetrating through the third insulating layer 7 and the fourth insulating layer 9 and exposing the coupling area of the second conductive wire 6 can be obtained by a single patterning process when the fourth insulating layer 9 is formed.

To this end, a preparation of the driving substrate shown in FIG. 2 is completed.

As a specific mode of the embodiment of the present disclosure, referring to FIG. 9, when the driving substrate referring to FIG. 3 is formed, after the step S2, the following steps S41 to S43 may be further included.

The first via hole H1 penetrating through the second insulating layer 4 (the planarization layer 41 and the passivation layer 42) can be obtained by a single patterning process when the planarization layer 41 is formed, that is, when the subsequent steps are performed, the first via hole H1 has been already formed.

Figure 9A:
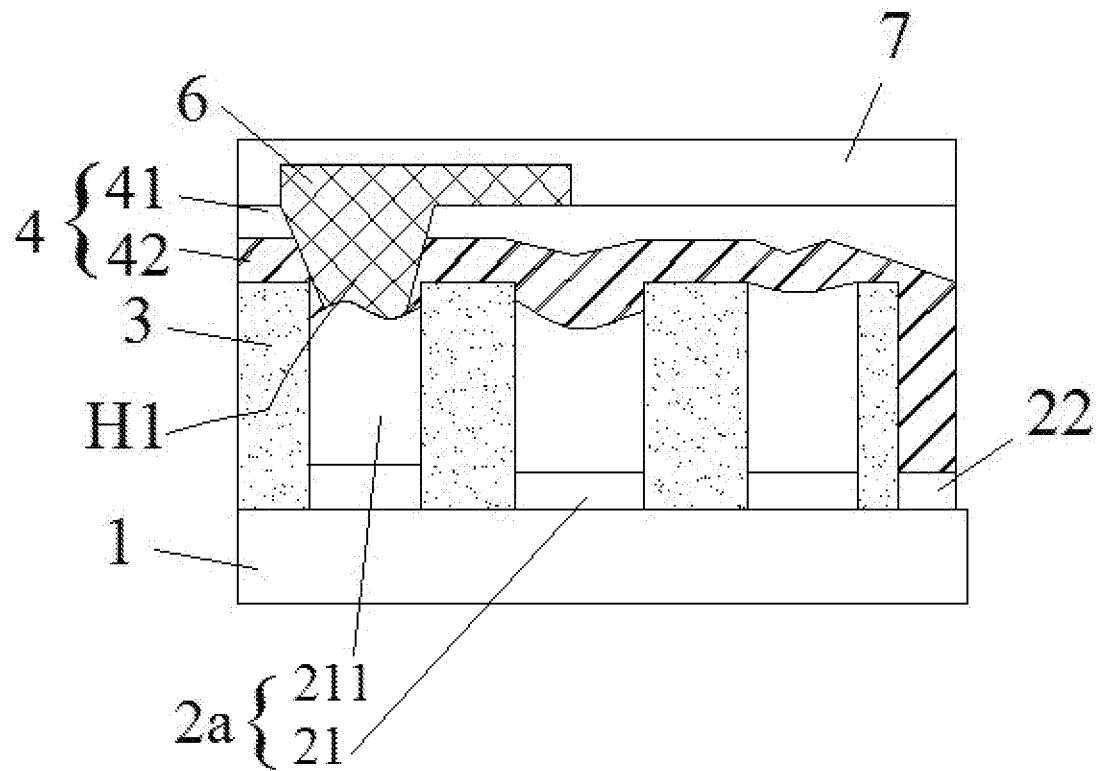
FIGS. 9a to 9b are schematic product configuration diagrams of the driving substrate shown in FIG. 3 at different stages of fabrication.

At step S41, referring to FIG. 9a, the third insulating layer 7 as above is formed by using a patterning process.

At this time, no via hole is formed in the third insulating layer 7.

Figure 9B:
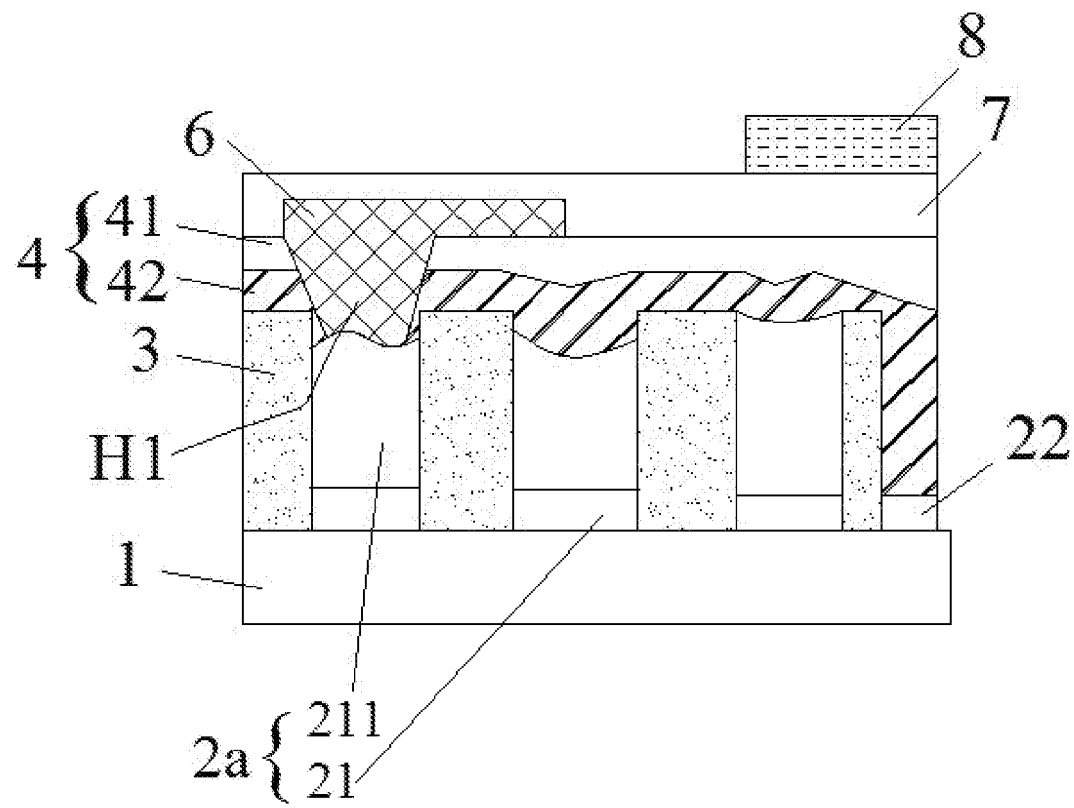

At step S42, referring to FIG. 9b, the light-reflecting layer 8 as above is formed by using a patterning process.

Since there is no via hole in the third insulating layer 7, the light-reflecting layer 8 is floating.

At step S43, referring to FIG. 3, the fourth insulating layer 9 as above is formed by using a patterning process.

Obviously, the second via hole H2 penetrating through the third insulating layer 7 and the fourth insulating layer 9 and exposing the coupling area of the second conductive wire 6 can be obtained by a single patterning process when the fourth insulating layer 9 is formed.

As can be seen, for the driving substrate referring to FIG. 3, since the light-reflecting layer 8 is floating, a process of forming a via hole is not required after the third insulating layer 7 is formed, which can save one patterning process (one mask) to simplify the process.

Figure 10A:
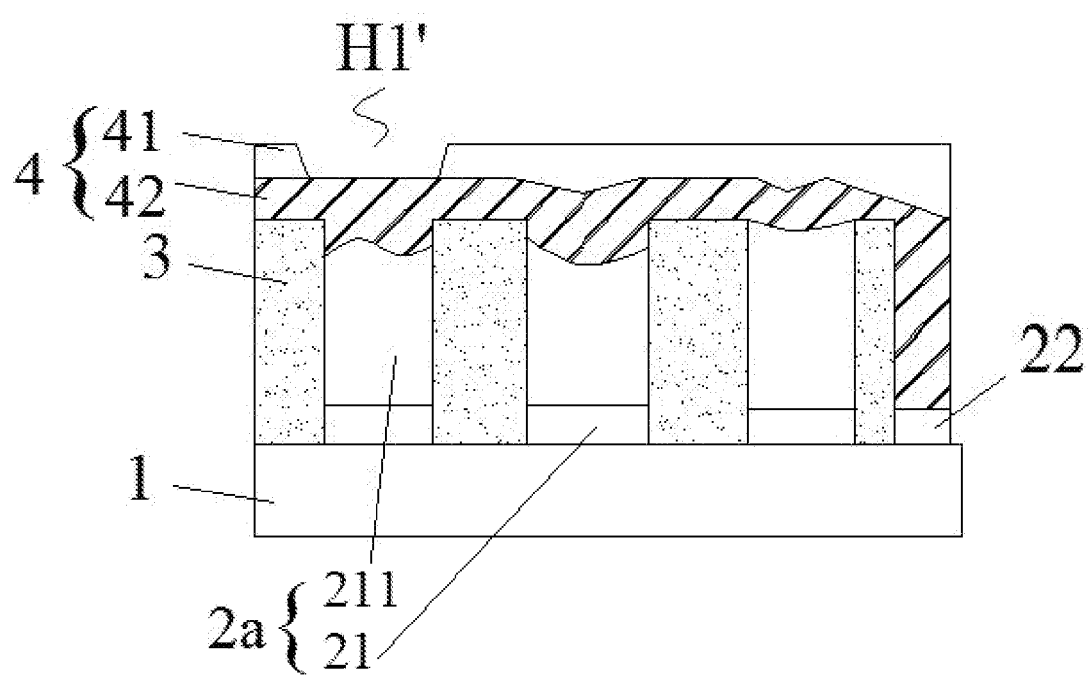
FIGS. 10a to 10c are schematic product configuration diagrams of the driving substrate shown in FIG. 4 at different stages of fabrication.

As a specific mode of the embodiment of the present disclosure, referring to FIG. 10, when the driving substrate referring to FIG. 4 above is formed, after the step S2, the following steps S51 to S54 may be further included.

In the process of forming the first via hole H1, only the planarization layer 41 may be etched first, and the passivation layer 42 may not be etched. Thus, referring to FIG. 10a, before the subsequent steps begin, there is a first sub-via hole H1' only penetrating through the planarization layer 41.

Figure 10B:
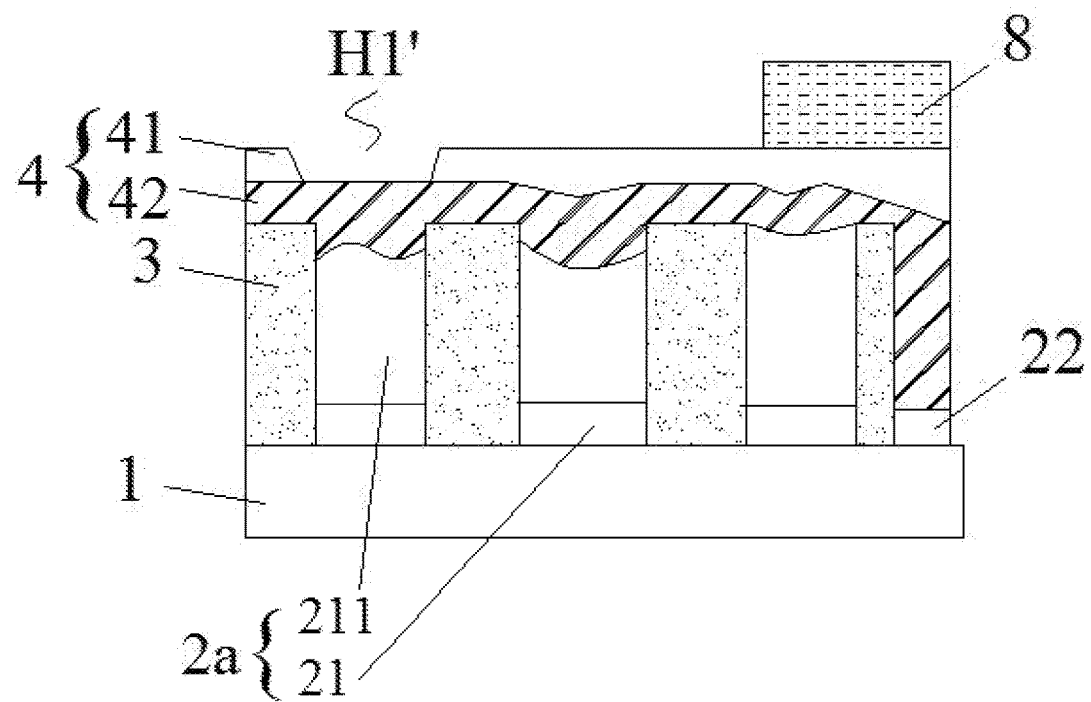

At step S51, referring to FIG. 10b, the light-reflecting layer 8 is formed by using a patterning process.

Since a portion of the light-reflecting layer 8 corresponding to the first via hole H1 is to be removed, the structure at the first via hole H1 may be affected by etchant for etching the light-reflecting layer 8 (etchant for etching metal); if the first via hole H1 penetrates through the second insulating layer 4, the first conductive wire 2a communicating to the first via hole H1 may be damaged by etching.

Therefore, before the present step, the first sub-via hole H1' penetrating through only a portion (the planarization layer 41) of the second insulating layer 4 may be formed, so as to protect the first conductive wire 2a.

Figure 10C:
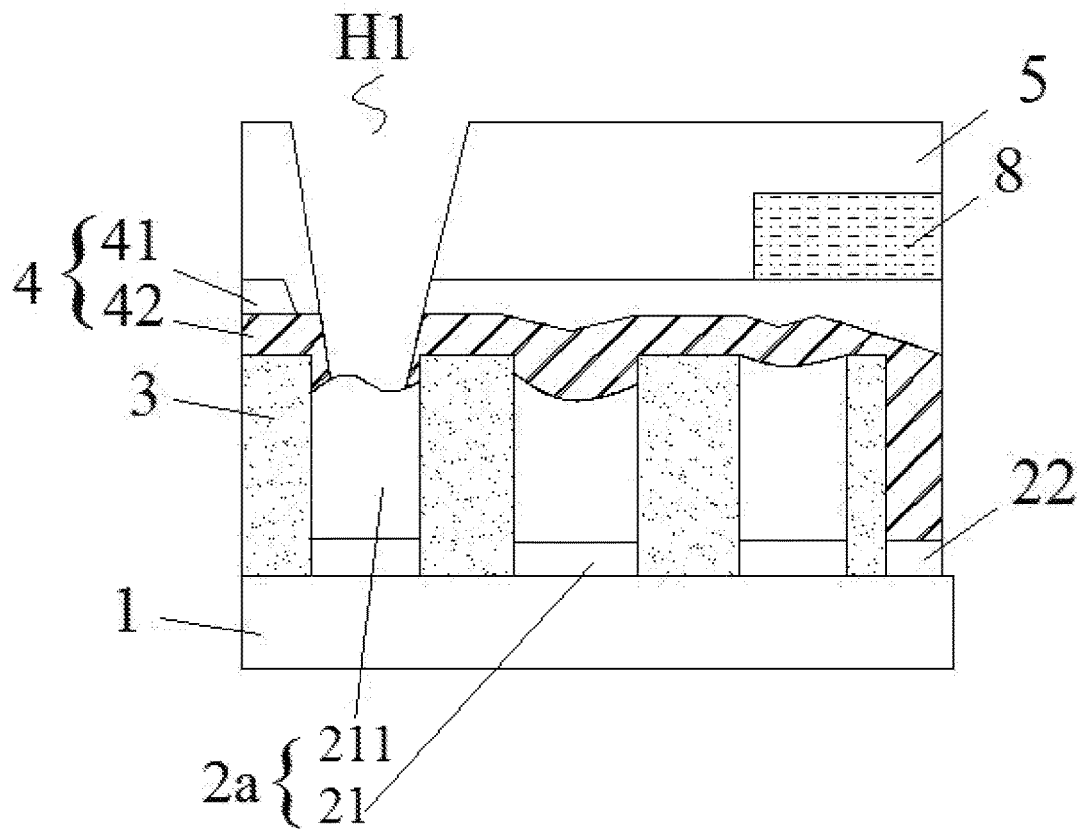

At step S52, referring to FIG. 10c, the fifth insulating layer 5 as above is formed by a patterning process.

Here, the remaining portion of the first via hole H1 penetrating through the fifth insulating layer 5 and the second insulating layer 4 can be obtained by a single patterning process when the fifth insulating layer 5 is formed, i.e., portions of the passivation layer 42 and the fifth insulating layer 5 corresponding to the first via hole H1 can be etched away (a corresponding portion of the planarization layer 41 has been removed in advance) in this step.

The reason why the planarization layer 41 is removed in advance is that the planarization layer 41 usually includes an organic material, and the passivation layer 41 and the fifth insulating layer 5 usually includes inorganic materials, and thus the two structure layers (the passivation layer 41 and the fifth insulating layer 5) can be removed together by an etchant in this step.

Certainly, it is also possible if, before step S51, the first sub-via H1' is not formed in advance but the fifth insulating layer 5 and the second insulating layer 4 are etched through in this step.

At step S53, the second conductive wire 6 as above is formed.

At step S54, referring to FIG. 4, the sixth insulating layer 10 as above is formed.

As can be seen, for the driving substrate referring to FIG. 4, since the light-reflecting layer 8 is floating and located below the second conductive wire 6, the number of patterning processes (masks) can be further reduced, and the process can be simplified.

An embodiment of the present disclosure further provides a light-emitting substrate, including:
  the driving substrate aforementioned;
  a plurality of light-emitting units each coupled to the coupling area; the light-emitting units are Micro-LEDs or Mini-LEDs.

The light-emitting units can be coupled to the driving substrate as above to form the light-emitting substrate capable of emitting light.

In some embodiments, the light-emitting substrate is a backlight substrate or a display substrate.

Specifically, the light-emitting substrate as above may be a backlight substrate of a direct-type backlight source used for a liquid crystal display device.

A size of the backlight substrate may be larger than that of the backlight substrate in the prior art, splicing is not needed, fine control on positions of the light-emitting units on the driving substrate is facilitated due to the fact that wires in the driving substrate is relative thin, and an improvement of light-emitting quality of the backlight substrate is facilitated.

Alternatively, the number of the light-emitting units in the light-emitting substrate may be large, and each light-emitting unit may be independently controlled, so that the light-emitting substrate may directly form a display substrate capable of displaying.

Specifically, the direct-type backlight can be obtained by assembling the driving substrate as above by the following steps S61 to S63.

Step S61, soldering the light-emitting unit (e.g., Micro-LED) on the exposed coupling area of the second conductive wire 6, to obtain the backlight substrate.

This step specifically includes the following steps of brushing tin on a steel mesh, solidifying crystals, reflow soldering, gluing and the like.

Step S62, bonding a flexible circuit board on the bonding pad of the backlight substrate.

Step S63, assembling the backlight substrate with an optical film (e.g., a light smoothing plate), a back plate, a frame, and the like to obtain the direct-type backlight.

An embodiment of the present disclosure further provides a display device, including:

the light-emitting substrate described above.

That is, the backlight substrate as above can be used to form a direct-type backlight source, and the direct-type backlight source is combined with a liquid crystal display panel to obtain the liquid crystal display device.

Alternatively, the display substrate as above may be combined with other structures (e.g., a power supply) to form the display device.

Specifically, the display device may be any product or component with a display function, such as a mobile phone, a tablet computer, a television, a display, a notebook computer, a digital photo frame, a navigator and the like.

Since a quality of emergent light is improved, a quality of the display device can also be improved.

It will be understood that the above embodiments are merely exemplary embodiments employed to illustrate the principles of the present disclosure, and the present disclosure is not limited thereto. It will be apparent to those skilled in the art that various modifications and variants may be made without departing from the spirit and scope of the embodiments of the disclosure, and such modifications and variants are considered to be within the scope of the present disclosure.

The invention claimed is:

1. A driving substrate, comprising:
   a base;
   a first insulating layer and a plurality of first conductive wires on the base; the first insulating layer is provided with openings, the first conductive wires are positioned in the openings, orthographic projections of the first conductive wires on the base overlap with orthographic projections of the openings on the base, and at any position in a lengthwise direction of the first conductive wires, each side surface of each of the first conductive wires is in contact with a side surface of the opening, where said each of the first conductive wires is positioned, at least at a partial height; each of the first conductive wires comprises a seed wire and a growth wire stacked sequentially in a direction away from the base;
   a plurality of second conductive wires positioned on a side of the first conductive wires away from the base; each second conductive wires is coupled to one of the first conductive wires and is provided with a coupling area for coupling a light-emitting unit;
   a second insulating layer on a side of the first conductive wires and the first insulating layer away from the base, and on a side of the second conductive wires proximal to the base; the second conductive wire is coupled to the first conductive wire through a first via hole at least penetrating through the second insulating layer;
   a light-reflecting layer on a side of the second insulating layer away from the base;
   a third insulating layer on a side of the second conductive wires away from the base, and a second via hole penetrating through at least the third insulating layer and communicating to the coupling area; the light-reflecting layer is positioned on a side of the third insulating layer away from the base; and
   a ground electrode on a side of the third insulating layer proximal to the base; the light-reflecting layer is coupled to the ground electrode through a third through hole at least penetrating through the third insulating layer.

2. The driving substrate according to claim 1, wherein
   a material of the first insulating layer comprises any one of polyimide resin, polyamide, polyurethane, phenol resin, and polysiloxane.

3. The driving substrate according to claim 2, wherein
   the second insulating layer is a planarization layer made of an organic insulating material; alternatively, the second insulating layer comprises a plurality of sub-layers which are stacked, the plurality of sub-layers comprising at least one planarization layer made of an organic insulating material and at least one passivation layer made of an inorganic material;
   a material of the planarization layer comprises any one of polyamide, polyurethane, phenolic resin and polysiloxane;
   a material of the passivation layer comprises any one of silicon oxide, silicon nitride and silicon oxynitride.

4. The driving substrate according to claim 2, wherein a material of the light-reflecting layer comprising any one of silver, aluminum, and copper.

5. The driving substrate according to claim 4, wherein a material of the third insulating layer comprises any one of silicon nitride, silicon oxide, and silicon oxynitride.

6. The driving substrate according to claim 1, wherein
   the ground electrode is positioned on a side of the second insulating layer proximal to the base;
   the light-reflecting layer is coupled to the ground electrode through the third via hole penetrating through the second insulating layer and the third insulating layer.

7. The driving substrate according to claim 4, wherein the light-reflecting layer is divided into a plurality of light-reflecting blocks spaced apart from each other.

8. The driving substrate according to claim 5, further comprising a fourth insulating layer on a side of the light-reflecting layer away from the base; the second via hole further penetrates through the fourth insulating layer; a material of the fourth insulating layer comprises any one of silicon nitride, silicon oxide, and silicon oxynitride.

9. The driving substrate according to claim 4, further comprising a fifth insulating layer on a side of the second conductive wires proximal to the base; a material of the fifth insulating layer comprises any one of silicon nitride, silicon oxide and silicon oxynitride; the light-reflecting layer is floating and is positioned on a side of the fifth insulating layer proximal to the base; the second conductive wire is coupled to the first conductive wire through the first via hole penetrating through the second insulating layer and the fifth insulating layer.

10. The driving substrate according to claim 9, further comprising a sixth insulating layer on a side of the second conductive wires away from the base, and a fourth via hole penetrating through the sixth insulating layer and communicating to the coupling area; a material of the sixth insulating layer comprises any one of silicon nitride, silicon oxide, and silicon oxynitride.

11. The driving substrate according to claim 1,
each of the first conductive wires has a thickness between 1 μm to 40 μm.

12. The driving substrate according to claim 1, wherein a surface of the first conductive wire away from the base is flush with a surface of the first insulating layer away from the base.

13. The driving substrate of claim 1, further comprising:
a buffer layer positioned on a side, facing the first insulating layer, of the base, and on a side, facing the base, of the first insulating layer and the first conductive wires; a material of the buffer layer comprises any one of silicon nitride, silicon oxide, and silicon oxynitride, the buffer layer having a thickness between 500 Å and 3000 Å.

14. The driving substrate according to claim 13, further comprising:
an anti-oxidation layer positioned between the buffer layer and the first insulating layer, and a material of the anti-oxidation layer comprises any one of silicon nitride, silicon oxide, silicon oxynitride, indium gallium zinc oxide, indium zinc oxide, gallium zinc oxide and indium tin oxide.

15. The driving substrate according to claim 1, wherein the seed wire comprises a first sub-seed wire, a second sub-seed wire sequentially stacked in the direction away from the base;
a material of the first sub-seed wire comprises any one of molybdenum, molybdenum alloy, titanium alloy, indium gallium zinc oxide, indium zinc oxide, gallium zinc oxide and indium tin oxide;
a material of the second sub-seed wire comprises copper or gold;
a material of the growth wire comprises copper.

16. The driving substrate according to claim 1, wherein each of the second conductive wires comprises a first sub-layer, a second sub-layer and a third sub-layer which are sequentially stacked in the direction away from the base;
a material of the first sub-layer comprises any one of molybdenum, molybdenum niobium, molybdenum titanium, molybdenum nickel titanium, the first sub-layer having a thickness between 50 Å to 500 Å;
a material of the second sub-layer comprises copper;

a material of the third sub-layer comprises nickel gold.

17. A method of manufacturing a driving substrate, comprising:
forming a first insulating layer and a plurality of first conductive wires on a base; the first insulating layer is provided with openings, orthographic projections of the first conductive wires on the base overlap with orthographic projections of the openings on the base, and at any position in a lengthwise direction of the first conductive wires, each side surface of each of the first conductive wires is in contact with a side surface of the opening, where the first conductive wire is located, at least at a partial height; each of the first conductive wires comprises a seed wire and a growth wire which are sequentially stacked in a direction away from the base;
forming a plurality of second conductive wires; each second conductive wires is coupled to one of the first conductive wires and is provided with a coupling area for coupling a light-emitting unit;
forming a second insulating layer on a side of the first conductive wires and the first insulating layer away from the base, and on a side of the second conductive wires proximal to the base; the second conductive wire is coupled to the first conductive wire through a first via hole at least penetrating through the second insulating layer;
forming a light-reflecting layer on a side of the second insulating layer away from the base;
forming a third insulating layer on a side of the second conductive wires away from the base, and a second via hole penetrating through at least the third insulating layer and communicating to the coupling area; the light-reflecting layer is positioned on a side of the third insulating layer away from the base; and
forming a ground electrode on a side of the third insulating layer proximal to the base; the light-reflecting layer is coupled to the ground electrode through a third through hole at least penetrating through the third insulating layer.

18. The method according to claim 17, wherein the forming the first insulating layer and the plurality of first conductive wires on the base comprises:
forming a conductive seed layer on the base, wherein the seed layer comprises a plurality of seed wires;
forming the first insulating layer; the seed wires are positioned in the openings, and a side surface of each of the seed wire is in contact with a side surface of the first insulating layer at the opening where said each of the seed wire is located;
depositing a conductive material on the seed wires by an electroplating process to form the first conductive wires.

19. A light-emitting substrate, comprising:
the driving substrate according to claim 1;
a plurality of light-emitting units each coupled to the coupling area; the light-emitting units are Micro-LEDs or Mini-LEDs.

* * * * *